(12) United States Patent
Melcher et al.

(10) Patent No.: US 9,453,487 B2
(45) Date of Patent: Sep. 27, 2016

(54) PIEZOELECTRIC COMPONENT AND METHOD FOR PRODUCING A PIEZOELECTRIC COMPONENT

(71) Applicant: Robert Bosch GmbH, Stuttgart (DE)

(72) Inventors: Reinhold Melcher, Erlangen (DE); Jan Benes, Bamberg (DE)

(73) Assignee: Robert Bosch GmbH, Stuttgart (DE)

( * ) Notice: Subject to any disclaimer, the term of this patent is extended or adjusted under 35 U.S.C. 154(b) by 352 days.

(21) Appl. No.: 14/152,044

(22) Filed: Jan. 10, 2014

(65) Prior Publication Data

US 2014/0191621 A1  Jul. 10, 2014

(30) Foreign Application Priority Data

Jan. 10, 2013  (DE) .................... 10 2013 200 243

(51) Int. Cl.
| | |
|---|---|
| *F02M 65/00* | (2006.01) |
| *H01L 41/083* | (2006.01) |
| *H01L 41/273* | (2013.01) |
| *H01L 41/29* | (2013.01) |
| *H01L 41/338* | (2013.01) |
| *H01L 41/09* | (2006.01) |
| *H01L 41/113* | (2006.01) |

(52) U.S. Cl.
CPC ........ *F02M 65/003* (2013.01); *H01L 41/0831* (2013.01); *H01L 41/273* (2013.01); *H01L 41/29* (2013.01); *H01L 41/338* (2013.01); *H01L 41/0986* (2013.01); *H01L 41/1132* (2013.01); *Y10T 29/42* (2015.01)

(58) Field of Classification Search
CPC .. H03H 9/0595; H03H 9/19; H03H 9/02157; H01L 41/09; H01L 41/083; B06B 1/0655; F02M 65/003

USPC ................. 310/364, 367, 368, 369
See application file for complete search history.

(56) References Cited

U.S. PATENT DOCUMENTS

| | | | | |
|---|---|---|---|---|
| 7,019,445 | B2 * | 3/2006 | Zhang .................. | H01L 41/314 29/25.35 |
| 8,994,252 | B2 * | 3/2015 | Nakanishi ................ | H03H 9/19 310/320 |
| 2002/0149296 | A1 * | 10/2002 | Fujii .................... | B41J 2/14233 310/328 |
| 2002/0149297 | A1 * | 10/2002 | Yamamoto ............ | H01L 41/083 310/328 |
| 2003/0020564 | A1 * | 1/2003 | Nishimura ............. | H03H 9/177 333/187 |
| 2010/0156251 | A1 * | 6/2010 | Hohmann ........... | H01L 41/0472 310/364 |
| 2013/0257222 | A1 * | 10/2013 | Funakubo ............. | H01L 41/047 310/317 |

FOREIGN PATENT DOCUMENTS

DE   102010000827    7/2011

* cited by examiner

*Primary Examiner* — Shawki S Ismail
*Assistant Examiner* — Bryan Gordon
(74) *Attorney, Agent, or Firm* — Michael Best & Friedrich LLP

(57) ABSTRACT

A piezoelectric component (1), which serves in particular as a piezoelectric sensor or a piezoelectric actuator, comprises a main body (2). The main body (2) has a first ceramic layer (15), a second ceramic layer (16) and an inner electrode layer (17). An outer metallization (5) is provided here, applied to an outer side (3) of the main body (2) and contacting the inner electrode layer (17). The main body (2) has a removal of material (4), the removal of material (4) separating the outer metallization (5) from an end-face outer electrode (7), which is formed by a metallization (7) of an end face (6) of the main body (2). A method for producing a piezoelectric component (1) is also provided.

8 Claims, 5 Drawing Sheets

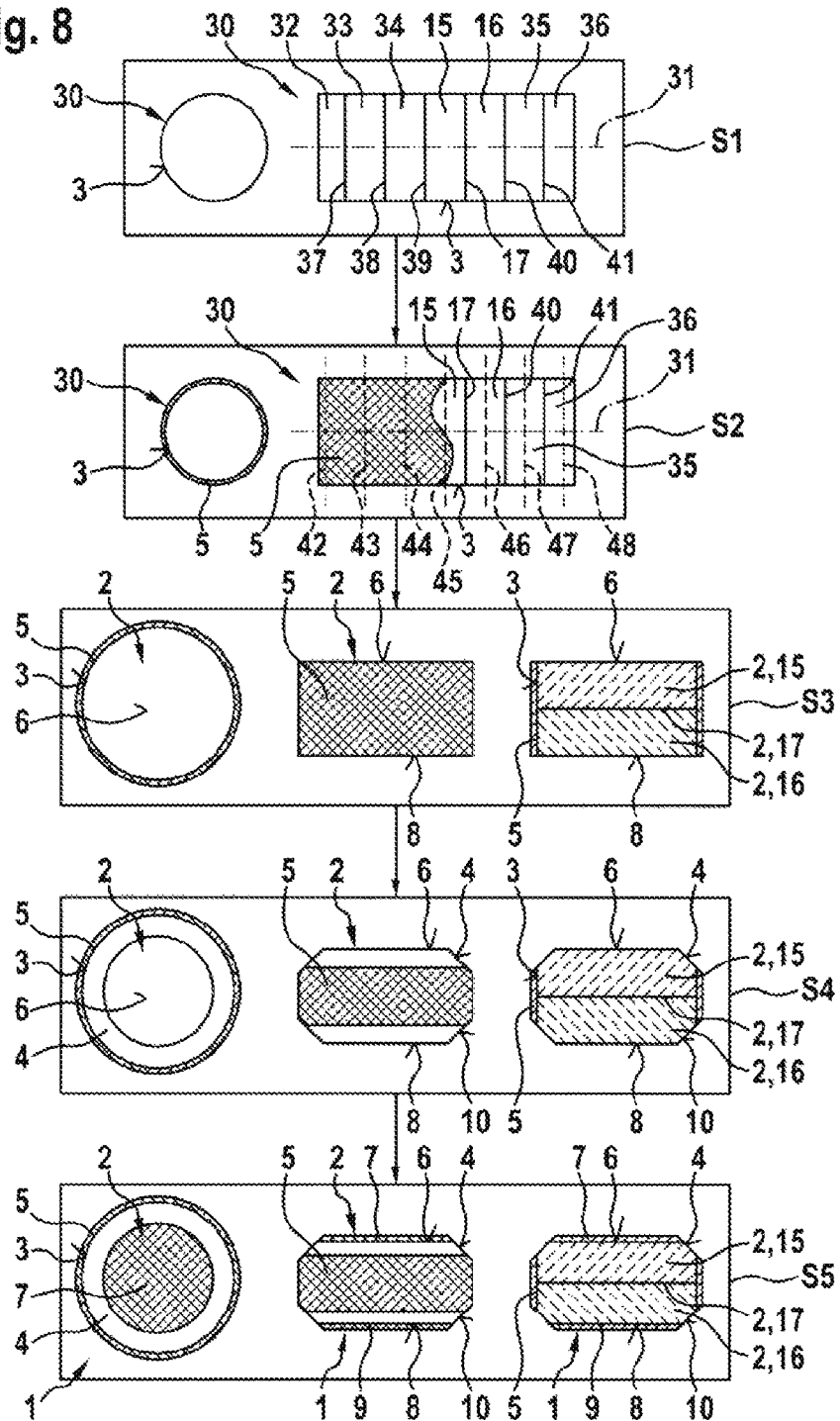

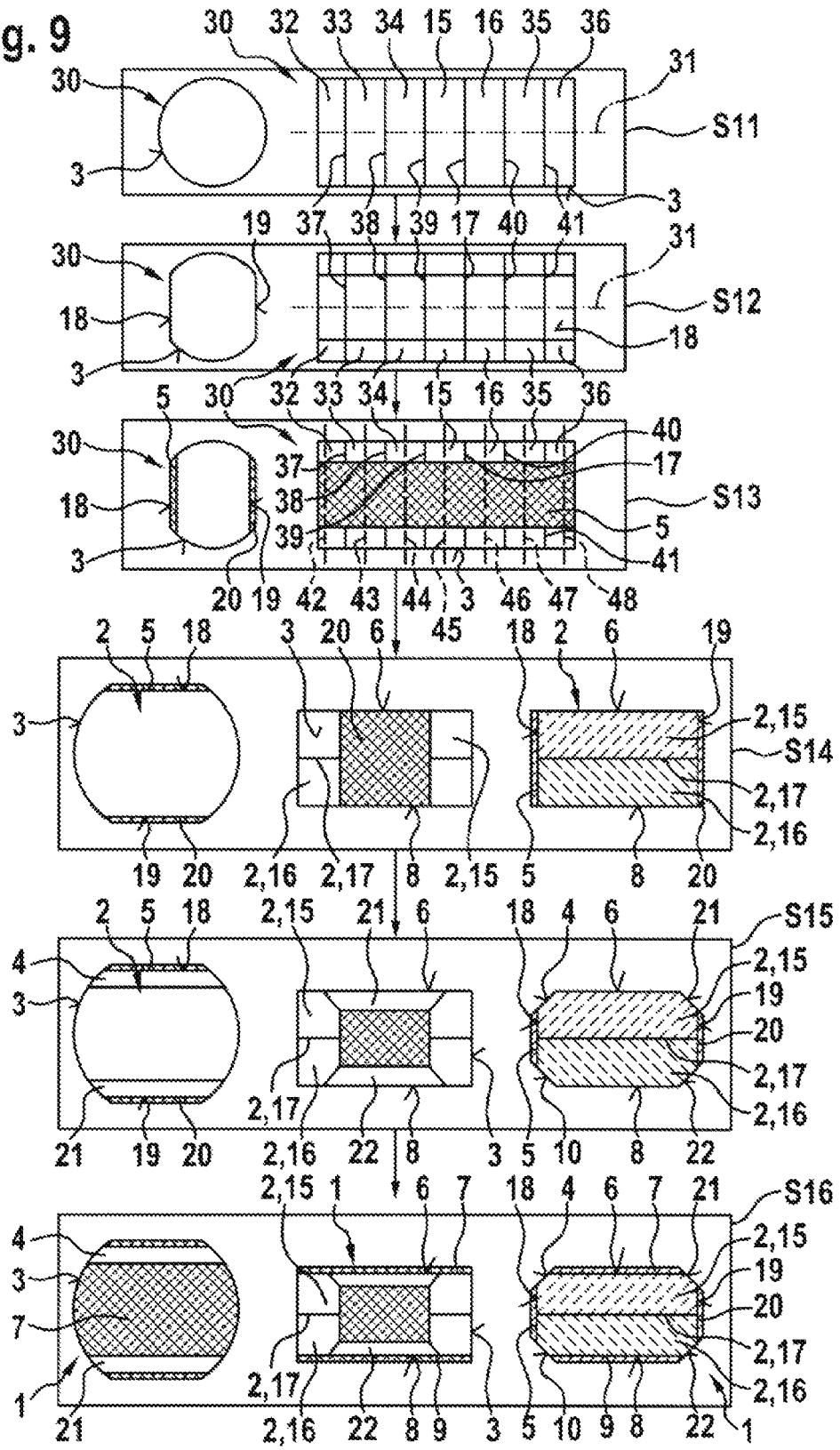

PIEZOELECTRIC COMPONENT AND METHOD FOR PRODUCING A PIEZOELECTRIC COMPONENT

BACKGROUND OF THE INVENTION

The invention relates to a piezoelectric component, in particular a piezoelectric sensor or a piezoelectric actuator, and to a method for producing such a piezoelectric component. The invention especially relates to the field of piezoceramic pressure sensors, which are used for pressure measurement in motor vehicles DE 10 2010 000 827 A1 discloses a fuel injector with a pressure sensor. In the case of the known fuel injector, the pressure sensor is assigned to a control chamber, the pressure of which determines the strokes or positions of a nozzle needle. The pressure sensor can be used to record the variation in the pressure in the control chamber.

In the configuration of a piezoelectric pressure sensor, it is conceivable to construct it from single or multiple active layers. If the signal of a single layer is not sufficient, increasing the number of active layers allows it to be correspondingly multiplied. The piezoelectric material may in this case be introduced into the production process in the form of round disks. Such round disks may be cut off from semifinished blanks in rod form and produced in great numbers. If, however, a multilayered construction of a piezo sensor is desired, in this case multiple single wafers such as these must be laboriously stacked up and connected to one another. The process steps required for this in terms of the constructing and connecting technology lead to various disadvantages. On the one hand, the production effort is great, which causes high costs. Furthermore, there are losses of tolerance and decreases in robustness.

SUMMARY OF THE INVENTION

The piezoelectric component according to the invention with the features of claim 1 and the method according to the invention with the features of claim 6 have the advantage that improved construction of the piezoelectric component and improved producibility are made possible. In particular, a construction with two ceramic layers and one inner electrode layer can be advantageously realized, contacting of the inner electrode layer arranged between the ceramic layers that is reliable and can be produced at low cost being possible. Furthermore, production of great numbers at low cost and with favorable aspects in terms of process technology can be made possible.

The piezoelectric component may have multiple ceramic layers. If the piezoelectric component has precisely two ceramic layers, that is the first ceramic layer and the second ceramic layer, and precisely one inner electrode layer, there are particular advantages in production. This is so because, with this configuration, the inner electrode layer can be contacted in a simple way by the outer metallization, which forms an outer electrode on the outer side of the main body. Furthermore, the end-face metallization can likewise be of a simple configuration. The main body with the inner electrode layer can in this case be advantageously cut off from the block in rod form. When cutting off, a separating plane in this case preferably lies respectively midway between two adjacent inner electrode layers of the block in rod form.

It is advantageous that, on a further end face of the main body that is remote from the end face there is applied a metallization, which forms a further end-face outer electrode, and that the main body has a further removal of material, which separates the outer metallization from the further end-face outer electrode. In this way, outer electrodes can be configured on both end faces of the main body. Together with the inner electrode layer, the two ceramic layers can consequently contribute to the function of the piezoelectric component. In particular, in this way a correspondingly great measuring signal or a correspondingly great stroke of the piezoelectric component can be achieved.

Furthermore, it is advantageous that the removal of material is configured as a bevel that is provided on the end face of the main body. It is correspondingly advantageous that the further removal of material is configured as a bevel that is provided on the further end face of the main body. In this case, the respective bevel can be configured by suitable beveling of the main body.

It is especially of advantage in this case that the main body is based on a cylindrical configuration, that the outer metallization is applied as one to an outer side of the main body in the form of a cylindrical shell and that the bevel that is provided on the end face of the main body encloses the end face of the main body in an annular manner and/or that the bevel that is provided on the further end face of the main body encloses the further end face of the main body in an annular manner. The inner electrode layer preferably arranged midway between the end faces of the main body can consequently be advantageously contacted by the outer metallization. Furthermore, the bevels can on the one hand be produced at low cost. On the other hand, in this way the amount of ceramic material removed can be reduced. Furthermore, with the removals of material configured in the form of bevels, the risk of damage to the component is low, as a result of which a high product yield is obtained.

In the case of a further possible configuration, it is advantageous that the main body is based on a cylindrical configuration with at least one lateral flattening on the outer side, that the outer metallization is applied on the lateral flattening of the main body and that the bevel that is provided on the end face of the main body runs on the end face in a straight line along the lateral flattening of the main body and/or that the bevel that is provided on the further end face of the main body runs on the further end face in a straight line along the lateral flattening of the main body. This produces the advantage that the metallization of the lateral flattening can be realized simply in terms of process technology. The lateral flattening can especially be configured in a planar form, so that the metallization can be applied particularly easily. Furthermore, in the case of this configuration, a limitation of the metallization to the lateral flattening can also be specifically achieved.

It is also possible in this case that a further lateral flattening is provided on the main body, that a further outer metallization is applied on the further lateral flattening of the main body and that a bevel that is provided on the end face of the main body runs on the end face in a straight line along the further lateral flattening of the main body and/or that a bevel that is provided on the further end face of the main body runs on the further end face in a straight line along the further lateral flattening of the main body. In particular, the lateral flattening and the further lateral flattening may be facing away from one another. The metallization on the lateral flattening and the further metallization on the further lateral flattening consequently allow two outer electrodes to be formed. These two outer electrodes can both be electrically contacted with the same inner electrode layer. In the case of a modified configuration, however, it is also possible that an alternating electrical contacting of two or more inner electrode layers is realized by way of the two metallizations on the two lateral flattenings. This allows the piezoelectric component also to be constructed from more than two ceramic layers and more than two inner electrode layers.

In the production of the piezoelectric component, it is advantageous that the block in rod form is provided with an outer metallization as one on the entire outer side. The block in rod form may especially be formed with an outer side in the form of a cylindrical shell. Furthermore, it is advantageous that the removal of material is configured in the form of a bevel, which encloses the end face of the main body in an annular form, on the end face of the main body and that the end face of the main body remaining within the bevel is coated with the metallization for the end-face outer electrode. The metallization for the end-face outer electrode may in this case be applied after the configuring of the bevel. However, the metallization may also be applied before the configuring of the bevel. Then, if appropriate, part of the end-face metallization may also be removed again when the bevel is introduced into the main body. This simplifies the production of the piezoelectric component.

However, it is also advantageous that a lateral flattening that extends along a longitudinal axis of the block in rod form is configured on the block in rod form and that the outer metallization is applied to the lateral flattening of the block. In this case, the outer side of the block in rod form may in particular only be coated on the lateral flattening. It is also advantageous in this case that the removal of material is configured in the form of a bevel, which runs in a straight line along the lateral flattening of the main body that is obtained from the lateral flattening of the block, on the end face of the main body, and that the end face of the main body remaining alongside the bevel is coated with the metallization for the end-face outer electrode. In this case, the metallization may be applied after the configuration of the bevel on the main body. However, the metallization may also be configured before the configuration of the bevel on the main body.

BRIEF DESCRIPTION OF THE DRAWINGS

Preferred exemplary embodiments of the invention are explained in more detail in the following description with reference to the accompanying drawings, in which corresponding elements are provided with the same designations and in which:

FIG. 8 shows a process flow diagram to explain a method for producing the piezoelectric component according to the first exemplary embodiment corresponding to one possible configuration and FIG. 9 shows a process flow diagram to explain a method for producing the piezoelectric component according to the second exemplary embodiment corresponding to one possible configuration of the invention.

DETAILED DESCRIPTION

Figure 1:
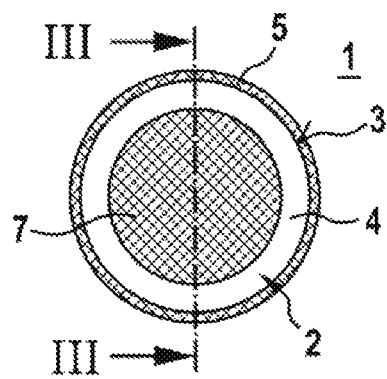
FIG. 1 shows a piezoelectric component corresponding to a first exemplary embodiment of the invention in a schematic representation.

FIG. 1 shows a piezoelectric component 1 in a schematic representation corresponding to a first exemplary embodiment. The piezoelectric component 1 may serve in particular as a piezoelectric sensor 1. Such a piezoelectric sensor 1 may be used in particular in fuel injection systems. For example, the piezoelectric sensor 1 may serve as a needle closing sensor, which monitors closing of a valve needle of a fuel injection valve. In this case, the sensor 1 may also measure a variation in pressure within a fuel chamber of the fuel injection valve. The sensor 1 may also be configured as a combustion chamber pressure sensor 1, which directly or indirectly measures the pressure in a combustion chamber of an internal combustion engine. The piezoelectric sensor 1 is however also suitable for other applications, in particular in the motor vehicle sector. The sensor 1 may especially also be used as a resources sensor for hydraulic or pneumatic applications. In a further possible configuration, the piezoelectric component 1 serves as a piezoelectric actuator 1.

The piezoelectric component 1 has a main body 2. The main body 2 has an outer side 3, which in this exemplary embodiment is configured as an outer side 3 in the form of a cylindrical shell. Also provided on the main body 2 is a removal of material 4, which is formed by a bevel 4.

Provided on the outer side 3 of the main body 2 is an outer metallization 5, which in this exemplary embodiment extends over the entire outer side 3 of the main body 2.

Also provided on the end face 6 (FIG. 2) of the main body 2 is an end-face outer electrode 7. The bevel 4 separates the outer metallization 5 from the end-face outer electrode 7.

Figure 2:
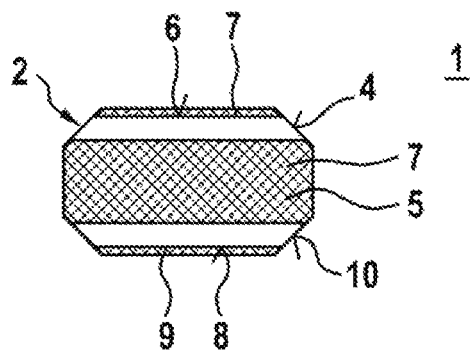
FIG. 2 shows the piezoelectric component according to the first exemplary embodiment of the invention that is represented in FIG. 1 in a schematic representation from the viewing direction denoted in FIG. 1 by II.

FIG. 2 shows the piezoelectric component 1 corresponding to the first exemplary embodiment that is represented in FIG. 1 in a schematic representation from the viewing direction denoted in FIG. 1 by II. The main body 2 has a further end face 8, on which a further end-face outer electrode 9 is attached.

The bevel 4 is configured in an annular form and encloses the end face 6. Also provided is a further removal of material 10, which is formed by a bevel 10. The bevel 10 is provided in the region of the further end face 8 and encloses the further end face 8 in an annular form. The further end-face outer electrode 9 is separated from the outer metallization 5 by the bevel 10.

Figure 3:
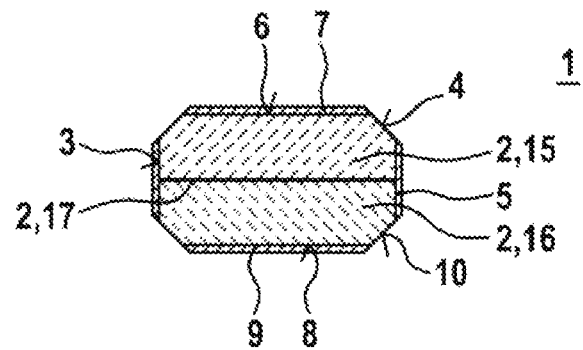
FIG. 3 shows the piezoelectric component according to the first exemplary embodiment that is represented in FIG. 1 in a schematic sectional representation along the sectional line denoted in FIG. 1 by III.

FIG. 3 shows the piezoelectric component 1 corresponding to the first exemplary embodiment that is represented in FIG. 1 in a schematic sectional representation along the sectional line denoted in FIG. 1 by III. The main body 2 has a first ceramic layer 15, a second ceramic layer 16 and an inner electrode layer 17. The inner electrode layer 17 is in this case arranged between the first ceramic layer 15 and the second ceramic layer 16. The outer metallization 5, which extends over the outer side 3 of the main body 2 in the form of a cylindrical shell, contacts the inner electrode layer 17.

This allows electrical terminals to be easily attached to the end-face outer electrode 7, the further end-face outer electrode 9 and the outer metallization 5 connected to the inner electrode layer 17.

Figure 4:
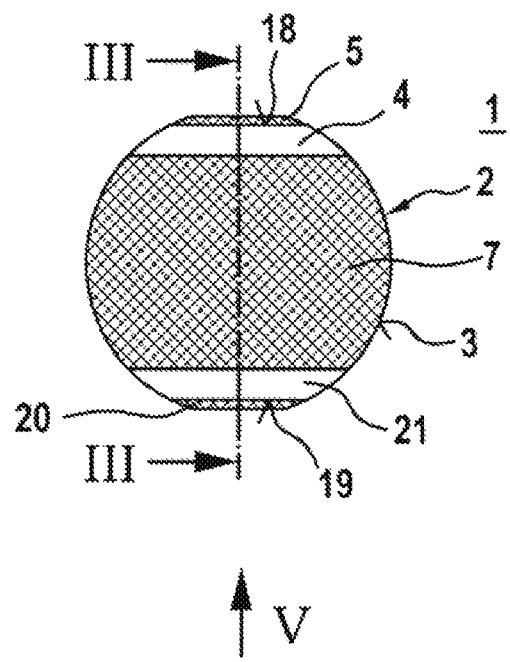
FIG. 4 shows a piezoelectric component corresponding to a second exemplary embodiment of the invention in a schematic representation.

FIG. 4 shows a piezoelectric component 1 according to a second exemplary embodiment in a schematic representation. In this exemplary embodiment, lateral flattenings 18, 19 are configured on the main body 2. The outer side 3 of the main body 2 is coated with outer metallizations 5, 20 only on the lateral flattenings 18, 19. Since the lateral flattenings 18, 19 are configured in a planar form, the outer metallizations 5, 20 can be easily applied.

Furthermore, in this exemplary embodiment removals of material 4, 21, which are formed by bevels 4, 21, are provided in the region of the end face 6 and the end-face outer electrode 7. In this case, the bevel 4 at the end face 6 extends along the lateral flattening 18. The bevel 21 at the end face 6 extends along the lateral flattening 19.

Figure 5:
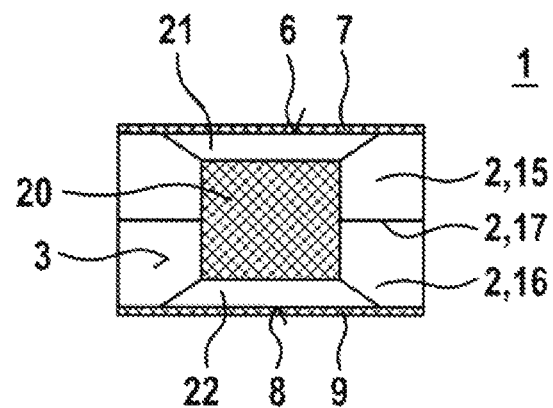
FIG. 5 shows the piezoelectric component according to the second exemplary embodiment of the invention that is represented in FIG. 4 in a schematic representation from the viewing direction denoted in FIG. 4 by V.

FIG. 5 shows the piezoelectric component 1 according to the second exemplary embodiment that is represented in FIG. 4 in a schematic representation from the viewing direction denoted in FIG. 4 by V. The bevel 21 is provided on one side, on the end face 6 or the end-face outer electrode 7. A further removal of material 22, which is formed by the bevel 22, is also provided on the further end face 8 or the further end-face outer electrode 9. The bevels 21, 22 extend in this case in a straight line along the lateral flattening 19, on which the outer metallization 20 is provided.

A schematic sectional representation of the piezoelectric component 1 according to the second exemplary embodiment that is represented in FIG. 1 along the sectional line denoted in FIG. 4 by III corresponds in this exemplary embodiment to a representation such as that shown in FIG. 3.

Figure 6:
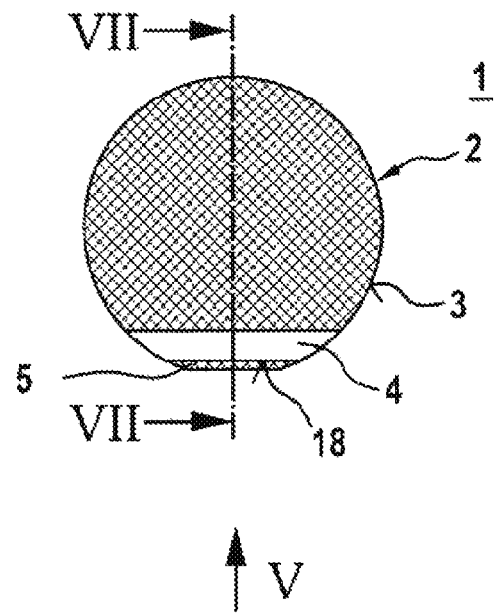
FIG. 6 shows a piezoelectric component corresponding to a third exemplary embodiment of the invention in a schematic representation.

FIG. 6 shows a piezoelectric component 1 corresponding to a third exemplary embodiment in a schematic representation. In this exemplary embodiment, the main body 2 has precisely one lateral flattening 18, on which the outer metallization 5 is provided. The bevel 4 extends in this case on the end face 6 in a straight line along the lateral flattening 18.

Figure 7:
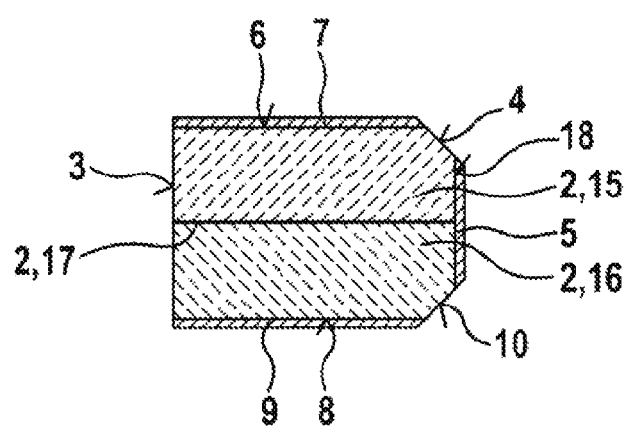
FIG. 7 shows the piezoelectric component according to the third exemplary embodiment of the invention that is represented in FIG. 6 in a schematic sectional representation along the sectional line denoted in FIG. 6 by VII.

FIG. 7 shows the piezoelectric component 1 according to the third exemplary embodiment that is represented in FIG. 6 in a schematic sectional representation along the sectional line denoted in FIG. 6 by VII. In this exemplary embodiment, the piezoelectric component 1 has precisely one outer metallization 5. This outer metallization 5 is configured on one side on the lateral flattening 18 on the outer side 3 of the main body 2. As a difference from this, in the case of the second exemplary embodiment described with reference to FIGS. 4 and 5, an outer metallization 5, 20 is provided on each of the two sides.

A side view of the piezoelectric component 1 corresponding to the third exemplary embodiment from the viewing direction denoted in FIG. 6 by V corresponds to the representation shown in FIG. 5 if the viewing direction denoted in FIG. 6 by V is chosen.

FIG. 8 shows a process flow diagram to explain a method for producing the piezoelectric component 1 according to the first exemplary embodiment corresponding to one possible configuration. In this case, steps S1 to S5 are shown. In steps S1, S2, a cross section of a block 30 in rod form is respectively shown on the left-hand side. The cross section has been chosen in this case perpendicularly in relation to a longitudinal axis 31 of the block 30 in rod form. In steps S1, S2, a longitudinal view of the block 30 in rod form is respectively shown on the right-hand side.

In steps S3, S4, S5, a plan view of the main body 2 such as that corresponding to the views chosen in FIG. 1 is respectively shown on the left-hand side. Respectively shown in the middle is a side view such as that corresponding to the view chosen in FIG. 2. A section through the main body 2 such as that corresponding to the view chosen in FIG. 3 is respectively shown on the right.

In step S1, the block 30 in rod form, which may be prepared as a semifinished blank, is used as starting material. The block 30 in rod form has a multiplicity of ceramic layers 15, 16, 32, 33, 34, 35, 36 and a multiplicity of inner electrode layers 17, 37, 38, 39, 40, 41 arranged between the ceramic layers 15, 16, 32 to 36. In this exemplary embodiment, the outer side 3 of the block 30 in rod form is configured in the form of a cylindrical shell. The block 30 in rod form is configured in this case in the form of a cylinder.

In step S2, which follows step S1, the outer side 3 is completely provided with an outer metallization 5. The outer metallization 5 consequently extends along the longitudinal axis 31 over the entire block 30 in rod form when the application of the outer metallization 5 has been completed. Subsequently, the block 30 in rod form is cut open at separating lines 42 to 48. The separating lines 42 to 48 may be in particular cutting lines 42 to 48. In particular, for example, a diamond saw may be used to cut up the block 30 in rod form into individual disks, each with two or more ceramic layers 15, 16, which can subsequently be re-worked on the end faces by grinding. In step S3, one of these disks is shown in the form of the main body 2. In this case, planar end faces 6, 8 are formed, the inner electrode layer 17 being arranged as far as possible midway between the end faces 6, 8. This can be achieved by a suitable choice of the cutting lines 45, 46. On account of the outer metallization 5 applied in step S2 over the entire outer side 3 of the block 30 in rod form, the outer side 3 of the main body 2 is also initially provided completely with the outer metallization 5. The end faces 6, 8 are still exposed.

In step S4, which follows step S3, the bevels 4, 10 are configured on the main body 2 in the region of the end faces 6, 8.

In step S5, which follows step S4, end-face outer electrodes 7, 9 are attached to the end faces 6, 8. The outer metallization 5 is then separated on the one hand from the end-face outer electrode 7 by the bevel 4 and on the other hand from the end-face outer electrode 9 by the bevel 10.

Once step S5 has been completed, the piezoelectric component 1 has been produced.

The block 30 in rod form is preferably produced such that the inner electrode layers 17, 37 to 41 are spaced apart equidistantly from one another along the longitudinal axis 31. Correspondingly, the separating lines 42 to 48 are then placed equidistantly in relation to one another. The separating lines 43 to 47 are then preferably located respectively midway between adjacent inner electrode layers 17, 37 to 41. The outermost separating lines 42, 48 are then determined in their position on the basis of the prescribed equidistance. As a result, main bodies 2 of the same size, in which the inner electrode layers 17, 37 to 41 respectively lie between the corresponding end faces 6, 8, are cut off, In the case of a modified configuration, the metallization of the end faces 6, 8, described on the basis of step S5, is carried out before step S4, in which the bevels 4, 10 are configured on the main body 2.

FIG. 9 shows a process flow diagram to explain a method for producing the piezoelectric component according to the second exemplary embodiment corresponding to one possible configuration. Method steps S11 to S16 are shown here. The representation chosen in method steps S11 to S13 corresponds to the representation that is chosen in FIG. 8 for method steps S1, S2. The representation chosen in method steps S14 to 16 corresponds the representation that is chosen in FIG. 8 for method steps S3 to S5.

In step S11, the block 30 in rod form is produced as a semifinished blank. In this case, a layering of the multiplicity of ceramic layers 15, 16, 32 to 36 and electrode layers 17, 37 to 41 to form the block 30 is possible. The block 30 in rod form is preferably produced in this case as a ceramic multilayer structure. This may be realized by stacking up and laminating suitable green films, an inner electrode paste for the respective inner electrode layer 17, 37 to 41 being respectively applied after a certain number of green films by being printed on. The blocks 30 in rod form produced in this way can then be debindered and sintered. Consequently, production may be partially based on a conventional procedure, in which piezoceramic material in the form of semifinished blanks in rod form are used. However, the block 30 in rod form that is produced in step S11 already has the inner electrode layers 17, 37 to 41 at defined distances.

In step S12, which follows step S11, lateral flattenings 18, 19 are configured on the block 30 in rod form. This may take place for example by grinding the block 30 in rod form. The lateral flattenings 18, 19 are in this case configured on the entire block 30 in rod form along the longitudinal axis 31.

In step S13, which follows step S12, firstly the assigned outer metallization 5, 20 is respectively provided on the lateral flattenings 18, 19. The remaining part of the outer side 3 remains exposed.

Subsequently, in step S13, separation of the block 30 in rod form into individual pieces is performed by a diamond saw or the like. In this case, the individual separation takes place along separating lines 42 to 48. As a difference from the configuration described on the basis of FIG. 8, here there is the advantage that the inner electrode layers 17, 37 to 41 may possibly be visible on the exposed part of the non-metallized outer side 3, and consequently can be used for the alignment of the separating tool, in particular the diamond saw. One of the results of the individual separation is that a main body 2 with the outer metallizations 5, 20 is obtained, and this is considered further by way of example in steps S14 to S16.

In step S14, the individual main body 2 with the outer metallizations 5, 20 is chosen from the multiple individually separated disks of the block 30 in rod form.

In step S15, which follows step S14, the edges provided at the end faces 6, 8, between the metallized lateral flattenings 18, 19 and the end faces 6, 8, are provided with a total of four bevels 4, 10, 21, 22. Distances between the outer metallizations 5, 20 and the end faces 6, 8 are formed by the bevels 4, 10, 21, 22.

In step S16, which follows step S15, the end faces 6, 8 are provided with end-face outer electrodes 7, 9. Electrical insulation between the outer metallization 5, the further outer metallization 20, the end-face outer electrode 7 and the end-face outer electrode 9 is ensured by the bevels 4, 10, 21, 22. Consequently, for example, the end-face outer electrodes 7, 9 can be connected to ground, while the outer metallizations 5, 20 serve for picking off an electrical signal or for applying an electrical voltage to ground.

In the case of a modified configuration, step S16, in which the end-face outer electrodes 7, 9 are applied, may also be performed already before step S15.

Possibilities for using the piezoelectric component 1, in possibly correspondingly modified configurations, are multilayer sensors, multilayer actuators or other functional ceramic components 1. In particular, use in applications involving pressure and ultrasound is also possible.

The invention is not restricted to the exemplary embodiments described.

What is claimed is:

1. A piezoelectric component (1) with a main body (2), which has a first ceramic layer (15), a second ceramic layer (16) and an inner electrode layer (17), an outer metallization (5) being provided, applied to an outer side (3) of the main body (2) and contacting the inner electrode layer (17), the main body (2) having a removal of material (4) and the removal of material (4) separating the outer metallization (5) from an end-face outer electrode (7), which is formed by a metallization (7) of an end face (6) of the main body (2).

2. The piezoelectric component according to claim 1, characterized in that on a further end face (8) of the main body (2) that is remote from the end face (6) there is applied a metallization (9), which forms a further end-face outer electrode (9), and in that the main body (2) has a further removal of material (10), which separates the outer metallization (5) from the further end-face outer electrode (9).

3. The piezoelectric component according to claim 2, characterized in that the removal of material (4) is configured as a bevel that is provided on the end face (6) of the main body (2).

4. The piezoelectric component according to claim 3, characterized in that the main body (2) is based on a cylindrical configuration, in that the outer metallization (5) is applied as one to an outer side (3) of the main body (2) in the form of a cylindrical shell and in that the bevel (4) that is provided on the end face (6) of the main body (2) encloses the end face (6) of the main body (2) in an annular manner.

5. The piezoelectric component according to claim 3, characterized in that the main body (2) is based on a cylindrical configuration with at least one lateral flattening (18, 19) on the outer side (3), in that the outer metallization (5, 20) is applied on the lateral flattening (18, 19) of the main body (2) and in that the bevel (4, 21) that is provided on the end face (6) of the main body (2) runs on the end face (6) in a straight line along the lateral flattening (18, 19) of the main body (2).

6. The piezoelectric component according to claim 2, characterized in that the further removal of material (10) is configured as a bevel (10) that is provided on the further end face (8) of the main body (2).

7. The piezoelectric component according to claim 6, characterized in that the main body (2) is based on a cylindrical configuration, in that the outer metallization (5) is applied as one to an outer side (3) of the main body (2) in the form of a cylindrical shell and in that the bevel (10) that is provided on the further end face (8) of the main body (2) encloses the further end face (8) of the main body (2) in an annular manner.

8. The piezoelectric component according to claim 6, characterized in that the main body (2) is based on a cylindrical configuration with at least one lateral flattening (18, 19) on the outer side (3), in that the outer metallization (5, 20) is applied on the lateral flattening (18, 19) of the main body (2) and in that the bevel (10, 22) that is provided on the further end face (8) of the main body (2) runs on the further end face (8) in a straight line along the lateral flattening (18, 19) of the main body (2).

* * * * *